United States Patent
Ashtiani et al.

(10) Patent No.: US 6,500,321 B1
(45) Date of Patent: *Dec. 31, 2002

(54) CONTROL OF EROSION PROFILE AND PROCESS CHARACTERISTICS IN MAGNETRON SPUTTERING BY GEOMETRICAL SHAPING OF THE SPUTTERING TARGET

(75) Inventors: Kaihan A. Ashtiani, Sunnyvale, CA (US); Larry D. Hartsough, Berkeley, CA (US); Richard S. Hill, Atherton, CA (US); Karl B. Levy, Los Altos, CA (US); Robert M. Martinson, San Mateo, CA (US)

(73) Assignee: Novellus Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/519,429

(22) Filed: Mar. 2, 2000

Related U.S. Application Data (60) Provisional application No. 60/136,079, filed on May 26, 1999.

(51) Int. Cl.$^7$ ............................................. C23C 14/35
(52) U.S. Cl. ............................ 204/298.12; 204/298.03; 204/298.2; 204/298.22
(58) Field of Search ..................... 204/192.12, 192.13, 204/298.03, 298.12, 298.2, 298.22

(56) References Cited

U.S. PATENT DOCUMENTS

| | | | | |
|---|---|---|---|---|
| 3,669,871 A | * | 6/1972 | Elmgren et al. ............. | 204/298 |
| 4,100,055 A | | 7/1978 | Rainey ........................ | 204/298 |
| 4,198,283 A | | 4/1980 | Class et al. .................. | 204/298 |
| 4,747,926 A | * | 5/1988 | Shimizu et al. .............. | 204/298 |
| 5,032,246 A | | 7/1991 | Blazic et al. ........... | 204/298.12 |
| 5,178,739 A | * | 1/1993 | Barnes et al. .......... | 204/192.12 |
| 5,320,728 A | | 6/1994 | Tepman .................. | 204/192.12 |
| 5,435,965 A | | 7/1995 | Mashima et al. .............. | 419/8 |
| 5,482,611 A | | 1/1996 | Helmer et al. ......... | 204/298.17 |
| 5,490,915 A | | 2/1996 | Bracher ................ | 204/298.18 |
| 5,580,428 A | * | 12/1996 | Krivokapic et al. ..... | 204/192.2 |
| 5,643,823 A | | 7/1997 | Ho et al. ....................... | 437/67 |
| 5,676,810 A | * | 10/1997 | Schwendener ......... | 204/298.09 |
| 5,736,019 A | * | 4/1998 | Bernick ................ | 204/298.07 |
| 5,741,404 A | * | 4/1998 | Cathey .................. | 204/192.11 |
| 5,744,016 A | | 4/1998 | Yamada et al. ........ | 204/298.11 |
| 5,798,029 A | | 8/1998 | Morita .................. | 204/298.16 |
| 5,827,414 A | | 10/1998 | Westwood ............. | 204/298.12 |
| 5,865,961 A | | 2/1999 | Yokoyama et al. .... | 204/192.12 |
| 5,868,914 A | | 2/1999 | Landsbergen et al. . | 204/298.06 |
| 5,944,967 A | | 8/1999 | Kunz et al. ............ | 204/298.11 |
| 6,217,716 B1 | * | 4/2001 | Fai Lai .................. | 204/192.12 |

FOREIGN PATENT DOCUMENTS

| WO | WO 92/04482 | * 3/1992 | ........... C23C/14/34 |
|---|---|---|---|

OTHER PUBLICATIONS

H. Tsuge and S. Esho; *Angular Distribution of Sputterd Atoms from Polychrystalline Metal Targets,*, Journal of Applied Physics, vol. 52, No. 7, Jul. 1981, pp. 4391–4395.
G.K. Wehner, D. Rosenberg; *Angular Distribution of Sputterred Material*, Journal of Applied Physics, vol. 31, No. 1, Jan. 1960, pp. 177–179.

* cited by examiner

Primary Examiner—Steven H. Ver Steeg
(74) Attorney, Agent, or Firm—DeLio & Peterson, LLC; Robert Curcio (57) ABSTRACT

An apparatus and method for controlling and optimizing a non-planar target shape of a sputtering magnetron system are employed to minimize the redeposition of the sputtered material and optimize target erosion. The methodology is based on the integration of sputtered material from each point of the target according to its solid angle view of the rest of the target. The prospective target's geometry is optimized by analytically comparing and evaluating the methodology's results of one target geometry against that of another geometry, or by simply altering the first geometry and recalculating and comparing the results of the first geometry against the altered geometry. The target geometries may be of many different shapes including trapezoidal, cylindrical, parabolic, and elliptical, depending upon the optimum process parameters desired. A sputtering system is developed using this methodology, having a main magnet stack, a rotating magnet, a target having selected target shapes optimized for controlling erosion, downstream magnets, a substrate, and an electric field induced plasma stream.

30 Claims, 9 Drawing Sheets

CONTROL OF EROSION PROFILE AND PROCESS CHARACTERISTICS IN MAGNETRON SPUTTERING BY GEOMETRICAL SHAPING OF THE SPUTTERING TARGET

This application claims the benefit of U.S. Provisional Application No. 60/136,079 filed on May 26, 1999.

BACKGROUND OF THE INVENTION

1. Field of the Invention

The present invention relates to thin film deposition, and is particularly related to physical vapor deposition (PVD) of solid materials in connection with the fabrication of semiconductor integrated circuits. More particularly, this invention is related to a method for controlling the target erosion and process characteristics in a physical vapor deposition sputtering source. This invention relates to any sputtering source utilizing sputtering targets. However, specific teachings and examples will be given which relate to magnetron sputtering, and especially to hollow cathode magnetron (HCM) sputtering sources.

2. Description of Related Art

In a sputtering device, a target is subjected to bombardment by high energy ions to dislodge and eject material from the target onto a workpiece, such as a semiconductor wafer. A concise description of the related art of sputtering devices can be found in U.S. Pat. No. 4,198,283, issued to Class, et al., on Apr. 15, 1980, entitled, "Magnetron Sputtering Target and Cathode Assembly." Typically, sputtering equipment includes a vacuum chamber, a target containing the material to be sputtered, a process gas source that provides a process gas to the vacuum chamber, and equipment to generate an electric field. The target forms part of a cathode assembly in the evacuated chamber containing the process gas, which is typically an inert gas, such as argon. The electric field is applied between the cathode assembly and an anode in the chamber, and the gas is ionized by collision with electrons ejected from the surface of the cathode, i.e., the electric field generates a plasma between the target and the susceptor, and accelerates the ionized gas atoms towards the target. The positive gas ions are attracted to the cathode surface, where they impact the target and dislodge particles from the target material. Once free from the target, these dislodged particles deposit themselves upon the substrate as a thin film.

One method of enhancing conventional sputtering processes is to arrange magnets behind or near the target to influence the path taken by electrons within the sputtering chamber, thereby increasing the frequency of collisions with sputtering gas atoms or molecules. In this type of magnetron sputtering device, the magnetic field is arranged orthogonal to the generated electric field. By increasing the plasma density proximate the target, the number of impacts on the target increases which directly correlates to an increased rate in film deposition on the substrate.

Sputtering apparatus are particularly sensitive to target shape for a number of reasons. The electric field distribution in the vicinity of the plasma discharge is influenced by the target shape because the target shape imposes a boundary condition upon the electric field in accordance with well-known laws of electrostatic theory. Moreover, the shape changes during the useful life of the target as target material is eroded away. Consequently, optimizing the target shape will enhance uniform deposition on the substrate throughout the useful life of the target.

The magnets are typically nickel, iron, or other ferromagnetic material, often assembled from separate segments to form an annular or rectangular body where the segments are separated by small gaps.

It is generally understood that atoms ejected from the surface of a sputter target leave at a variety of angles and that, at the vacuum levels employed in sputtering systems, the mean-free-path of the ejected metal atoms is small in comparison to the dimensions of the vacuum chamber, so that randomizing can occur. This randomization is due to collisions and gas scattering of sputtered species. In order to preserve the flux, the target-to-wafer distance is kept at a minimum to limit randomization.

In conventional magnetron sputtering, low pressures are implemented such that ejected atoms are not randomized. In ionized pvd, randomization or thermalization is needed to ionize the metal species that are sputtered off the target. By operating at high density plasma, a high ionization is achieved which ultimately may yield an isotropic distribution.

It has been a goal of manufacturers of sputtering systems to provide means for imparting greater directionality to the ejected target atoms which reach the semiconductor wafer.

Other prior art methods to improve directionality have included the following: a) increasing the distance between the sputter source and the substrate, wherein only those atoms that start out traveling at an angle close to an angle normal to the substrate will reach the substrate; b) installing a collimating filter between the source and the substrate, where the filter is essentially a network of elongated cell-like structures, each cell having an axis to the substrate surface such that atoms traveling at an acute angle are intercepted by the cell walls; c) plating using an ion beam; and d) applying an rf bias to the wafer substrate causing a negative charge to build up in a known manner, which in turn, causes gas and metal ions in the chamber to arrive to the substrate at angles close to the wafer normal.

Limitations, however, exist with the above-described methods. Increasing the distance between the sputter source and the substrate generates material loses and lower deposition rate, and is considered very inefficient. Similarly, when a collimating filter is installed, much of the target material is wasted, i.e., it does not get deposited on the substrate, and instead is accumulated on the filter cell walls. Ion plating causes space charge effects that prevent the use of a beam with sufficient flux to provide an acceptable deposition rate. Lastly, applying an rf bias on the wafer may cause undue electrical stress to the wafer elements.

Bearing in mind the problems and deficiencies of the prior art, it is therefore an object of the present invention to provide a method for making a physical vapor deposition source for depositing metalization layers onto a substrate with an improved degree of directionality.

It is another object of the present invention to provide a method for making a directional source for depositing metal layers which have an acceptably high deposition rate.

A further object of the present invention is to provide for uniform erosion/removal of material from a physical vapor deposition sputtering target.

Another object of the present invention is to prevent redeposition of target material back onto the target.

Yet another object of the present invention is to provide a method for shaping a non-planar target as means of controlling target erosion.

Still another object of the present invention is to provide a method for shaping of a non-planar target as means of improving target life and utilization.

A further object of the present invention is to provide a method for shaping of a non-planar target as a means of controlling particulate generation for ultra-clean magnetron sputtering applications.

Yet another object of the present invention is to provide a method for shaping of a non-planar target as a means of controlling process characteristics such as $R_s$ uniformity, step coverage, and the like.

Still other advantages of the invention will in part be obvious and will in part be apparent from the specification.

SUMMARY OF THE INVENTION

The above and other advantages, which will be apparent to one of skill in the art, are achieved in the present invention which is directed to, in a first aspect, a method of modeling non-planar sputtering target shapes including the steps of: a) selecting a first non-planar sputtering target geometry; b) dividing the non-planar sputtering target into a finite number of target segments, each segment defining a surface area of the target; c) calculating for each of the target segments a contribution of sputtered material from each of the other of the target segments; and, d) calculating the net erosion for each of the target segments.

This method may further include the steps of: e) selecting a second non-planar sputtering target geometry; f) performing the steps (b) through (d) on the second non-planar sputtering target geometry; and, g) comparing the net erosion calculations for the first and second non-planar target geometries.

Additionally this method may include: h) calculating process parameters for each of the target geometries; and, i) comparing the process parameter calculations for the first and second non-planar target geometries.

Furthermore, one may select a non-planar target geometry wherein the geometry is parabolic, cylindrical, elliptical, trapezoidal, hemispherical, or cone shaped. Other target shapes may include: cylindrical-elliptical, cylindrical-parabolic, cylindrical-trapezoidal, or cylindrical-domed.

A second non-planar target geometry may be selected, wherein the geometry is different from the first non-planar target geometry and is parabolic, cylindrical, elliptical, trapezoidal, hemispherical, or cone shaped. Each non-planar target may have a corrugated top surface.

In a second aspect, the invention relates to a method for optimizing a non-planar sputtering target shape comprising the steps of: a) selecting an initial non-planar sputtering target geometry; b) dividing the non-planar sputtering target into a finite number of target segments; c) calculating for each of the target segments a contribution of sputtered material from each of the other of the target segments; d) calculating the net erosion for each of the target segments; e) calculating the redeposition of sputtered material from each of the target segments; f) calculating the net deposition from each of the target segments on a wafer; g) minimally altering the target geometry and performing steps (b) through (f); and, h) repeating the step (g) until the wafer has a calculated uniform thin-film deposition of target material and optimized minimum amounts of the redeposition and the target erosion.

This method may further including the steps of: i) calculating process parameters for the selected target geometry; and, j) comparing the process parameter calculations during the step (g) such that the process parameters are optimized.

In a third aspect, the invention relates to an apparatus for sputtering particles from a magnetron type target onto a substrate, the apparatus comprising: a) a vacuum chamber for enclosing the target and the substrate; b) a process gas source; c) the magnetron type target having a geometry optimized by the method delineated above such that the target geometry is calculated to control erosion and redeposition of target material; d) a voltage source for producing an incident electric field to accelerate ionized gas atoms towards the target; and, e) a magnetic field source comprising: i) a rotating magnet; ii) downstream electromagnets; and, iii) a main magnet stack.

This apparatus may further comprise a target having a geometry comprising parabolic, cylindrical, elliptical, trapezoidal, hemispherical, or cone shaped targets. In this apparatus, the main magnet stack and the rotating magnets are comprised of electromagnets or permanent magnets.

In a fourth aspect, the present invention relates to an apparatus for sputtering particles from a magnetron type target onto a substrate, the apparatus comprising: a) a vacuum chamber for enclosing the target and the substrate; b) a process gas source; c) a trapezoidal sputtering target; d) a voltage source for producing an incident electric field to accelerate ionized gas atoms towards the target; and, e) a magnetic field source comprising: i) a rotating magnet; ii) downstream electromagnets; and, iii) a main magnet stack; and, f) an electric field induced plasma stream.

In a fifth aspect, the present invention relates to an apparatus for sputtering particles from a magnetron type target onto a substrate, the apparatus comprising: a) a vacuum chamber for enclosing the target and the substrate; b) a process gas source; c) the magnetron type target having a geometry optimized by the method delineated above such that the target geometry is calculated to control erosion and redeposition of target material; d) a voltage source for producing an incident electric field on the target; and, e) a magnetic field source comprising: i) a rotating magnet; ii) downstream electromagnets; and, iii) a main magnet stack.

In a sixth aspect, the present invention relates to a program storage device readable by a machine, tangibly embodying a program of instructions executable by the machine to perform the method steps for modeling non-planar sputtering target shapes, the method steps comprising: a) selecting a first non-planar sputtering target geometry; b) dividing the non-planar sputtering target into a finite number of target segments, each segment defining a surface area of the target; c) calculating for each of the target segments a contribution of sputtered material from each of the other of the target segments; and, d) calculating the net erosion for each of the target segments.

In a seventh aspect, the present invention relates to an apparatus for sputtering particles from a magnetron type target onto a substrate, the apparatus comprising: a) a vacuum chamber for enclosing the target and the substrate; b) a process gas source; c) the magnetron type target having a geometry comprising parabolic, cylindrical, elliptical, trapezoidal, hemispherical, or cone shaped targets; d) a voltage source for producing an incident electric field on the target; and, e) a magnetic field source comprising: i) a rotating magnet; ii) downstream electromagnets; and, iii) a main magnet stack.

In a eighth aspect, the present invention relates to a magnetron type target for physical vapor deposition having a parabolic, cylindrical, elliptical, trapezoidal, hemispherical, or cone shaped geometry.

In a ninth aspect, the present invention relates to a magnetron type target for physical vapor deposition having varying thickness and a parabolic, cylindrical, elliptical, trapezoidal, hemispherical, or cone shaped geometry.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–12 of the drawings in which like numerals refer to like features of the invention. Features of the invention are not necessarily shown to scale in the drawings.

To achieve uniform erosion, where erosion is considered the net removal of material of a physical vapor deposition sputtering target, traditionally, a magnetic circuit is designed such that it can be rotated behind the target to sweep all surfaces of the sputtering target by a high-density plasma. The ions from the plasma, usually an inert gas such as argon gas, are attracted to the target by the negative potential of the sputtering target, and material is sputtered, thereby eroding the target. Many different magnetic circuits are utilized to achieve this goal, as can be found in the prior art. While most sputtering targets are made in planar shape, recently, a new class of sputtering sources has been introduced in which the target shape is non-planar. An example of such a source is the hollow cathode magnetron sputtering source in which the target is non-planar in order to be able to create a high-density metal plasma in addition to the usual argon plasma. An example of this type of magnetron can be found in U.S. Pat. No. 5,482,611, issued to Helmer, et al., on Jan. 9, 1996, entitled "Physical Vapor Deposition Employing Ion Extraction From a Plasma," and is incorporated herein by reference.

The planar shape of a sputtering target has been considered the most optimized shape for achieving uniform erosion of the target since the sputtered material has minimal chance of redepositing back on the surface of the target. Such redeposition can degrade erosion behavior of the sputtering target or make it difficult to model or predict. In addition, it can cause arcing and flaking of the target material which is detrimental for processes where pristine surfaces are needed during and after sputtering process. For example, applications in semiconductor processing require such high levels of cleanliness that an addition of more than ten particulates of 0.2 $\mu$m or greater in size on a 200 mm wafer can be detrimental to the overall yield of devices being manufactured on the wafer.

Figure 1A:
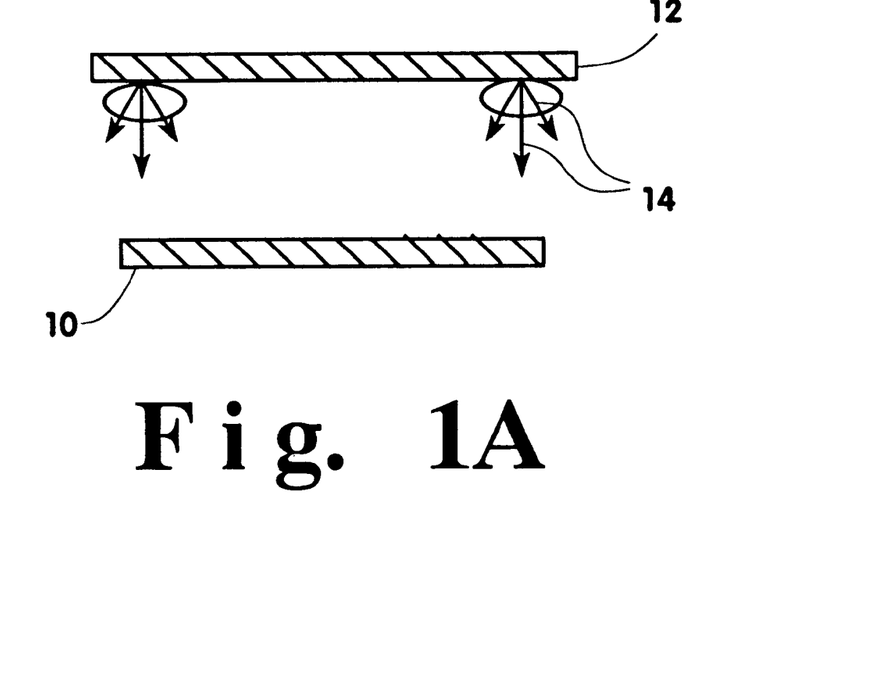
FIG. 1A is a schematic of a planar metallic target showing the ejection distribution of sputtered material.
Figure 1B:
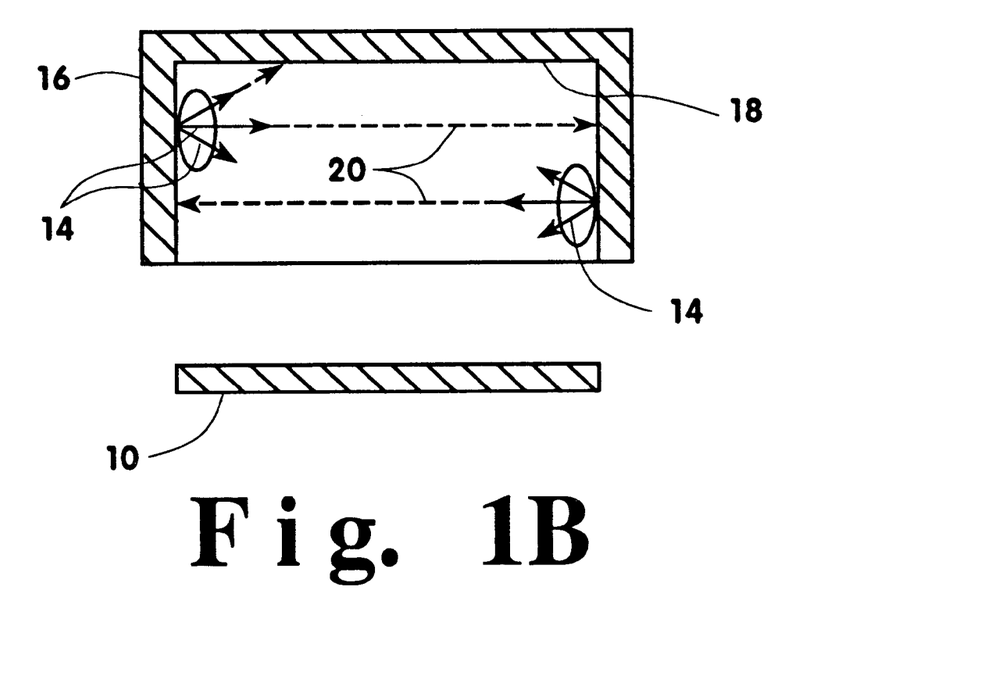
FIG. 1B is a schematic of a simple non-planar metallic target showing the redepostion of sputtered material.

For non-planar targets, such as that used in HCM sputtering, the redeposition of sputtered material back onto the target is enhanced since a large portion of the sputtered material has a direct line of sight to the target itself. FIGS. 1A and 1B show comparison of a planar and a simple non-planar metallic target in terms of ejection distribution of sputtered material. As shown in FIG. 1A, substrate 10 is bombarded by target particles emitted from the planar target 12 in a plurality of directions 14 that ultimately form an accumulation of target material on substrate 10. The angular distribution of the sputtered metallic target material is described by a cosine functional form. As such, the emission at angles close to 90° from normal to the target surface will approach zero, thereby accumulating little of the target material on substrate 10, while usually maximum emission is obtained for angles less than 45° from the normal to the surface. As it can be seen in FIG. 1B, in the case of the non-planar target 16, having a top surface 18, a large portion of the sputtered material can be redeposited on the opposite target wall. This redeposition is indicated by dashed arrows 20. While the redeposited material is sputtered again, the target erosion behavior may be difficult to control or predict, i.e., target "build-up" occurs in the various places of maximum redeposition. In cases where redeposition overcomes the sputtering rate, eventual flaking and particulate generation may result.

Figure 2:
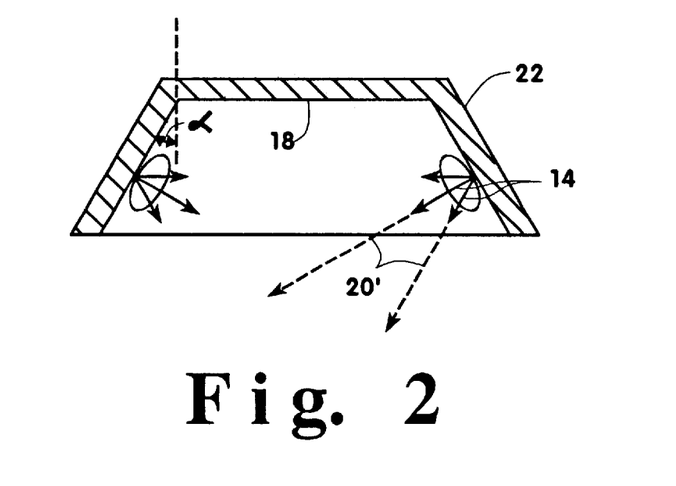
FIG. 2 is a schematic of a non-planar metallic target with an increased side wall angle.

Based on the above, it is desirable to optimize the non-planar target shape 16 in order to minimize the redeposition of the sputtered material and optimize target erosion. As shown in FIG. 2, the simplest approach would be to increase the side wall angle α of target 22, thus redirecting the sputtered material 20' outside of the target area. This would minimize the redeposition of the target material that would otherwise deposit back onto the target surface.

Since the deposition of the sputtered material takes on a cosine functional form, one can calculate the optimum target side wall angle based on the cosine distribution of the sputtered (emitted) material. The cosine functional forms are measured and referenced in the sputtering literature. In addition, since different material take on different cosine functional forms, non-planar targets can be designed specifically for given material types. For example, sputtered tantalum takes on a simple cosine sputter angular distribution, while aluminum can be grossly under cosine with the maximum emission peaking at approximately 35° for sputtering energies less than 1.0 KeV. This concept of distribution as a function of target material has been demonstrated by H. Tsuge and S. Esho, in "Angular Distribution of Sputtered Atoms from Polycrystalline Metal Targets," *Journal Applied Physics,* 52(7), July 1981. Therefore, it remains possible for target size and side wall angles for aluminum or tantalum to be geometrically determined and optimized based on the angular distribution of the sputtered material and the requirement of a minimum redeposition of the target material. One such example of this approach can be shown by altering the top face of the non-planar target 18. This custom designing of non-planar sputtering targets will greatly enhance erosion behavior of sputtering sources. Since uniform erosion of sputtering target increases the useful life of the target, a customized target designed to optimize erosion uniformity can significantly improve the cost of ownership of a sputtering source. In addition, since the uniformity of the deposited film on the wafer can be affected by the uniformity of the sputtered material from the target surface (as for example the non-planar target in FIG. 1B), the process uniformity of the sputtering system can be optimized by correct shaping or customizing of the sputtering target based on the above.

Figure 3:
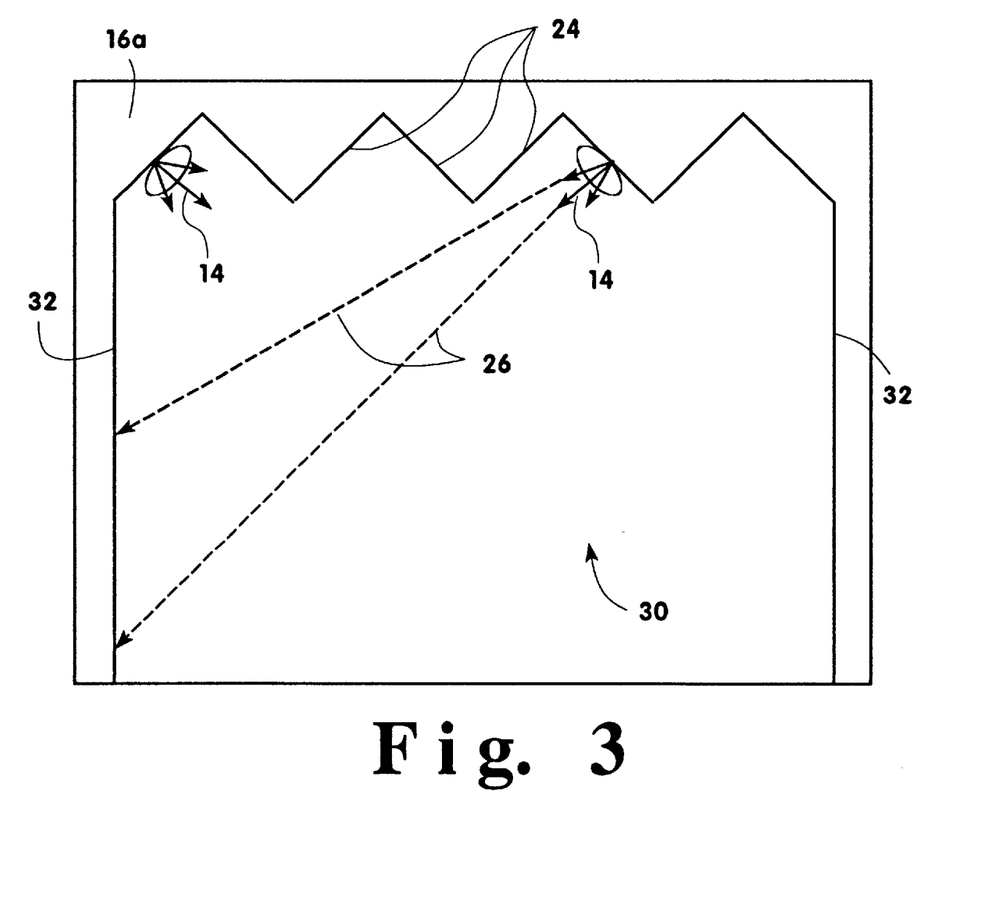
FIG. 3 is a schematic of a simple non-planar metallic target having a corrugated top face.

For certain applications, the angular distribution data of the sputtered material can be used to modify only a part of the target, such that one or more attributes of the process to be performed are enhanced. For example, due to differences in erosion rates between the top face of the target versus the target's side wall, it may be undesirable to have the material from the top face of the non-planar target 16, as shown in FIG. 1B, reach the processing surface. Alternatively, it may be desirable to control the particulate generation from the top face of the target. In either case, as indicated in FIG. 3, one can shape the top face 24 of the target 16a into a corrugated shape, such that the sputtered material from the top face, as indicated by dashed arrows 26, ends up on the side walls 32 of the target 16a. This design allows only an insignificant amount of target top surface material from exiting the target area 30 as shown in FIG. 3. This material mostly ends up on the side walls of the target which subsequently are sputtered out of the target and on to the wafer. Thus, side wall erosion and particulate generation can effectively be controlled.

Figure 4:
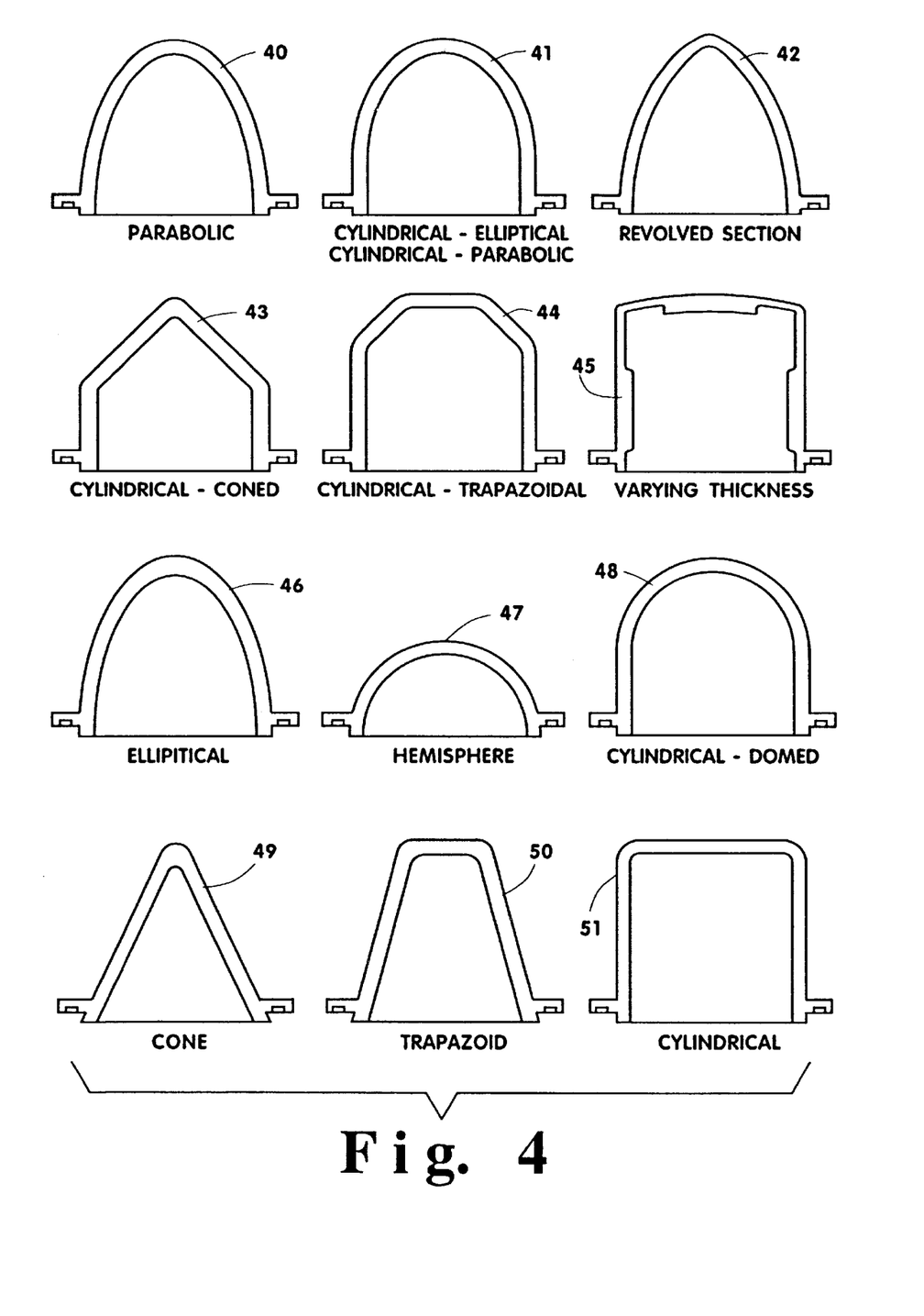
FIG. 4 is a schematic representation of various target shapes that can be used to tailor one or several attributes of the sputtering processes.

FIG. 4 depicts schematic representations of various target shapes, although not an exhaustive list, that can be used to tailor one or several attributes of the sputtering processes. These shapes range from parabolic 40, cylindrical 41, 43, 44, 48 and 51, elliptical 46, trapezoidal 50, varying thickness 45, cone shaped 49, hemispherical 47, and a revolved section 42. While many shapes can effectively be utilized with non-planar targets for the purposes of erosion control, a more precise modeling of different geometrical shapes is desirable if one of ordinary skill in the art is to achieve the best possible erosion.

Figure 5:
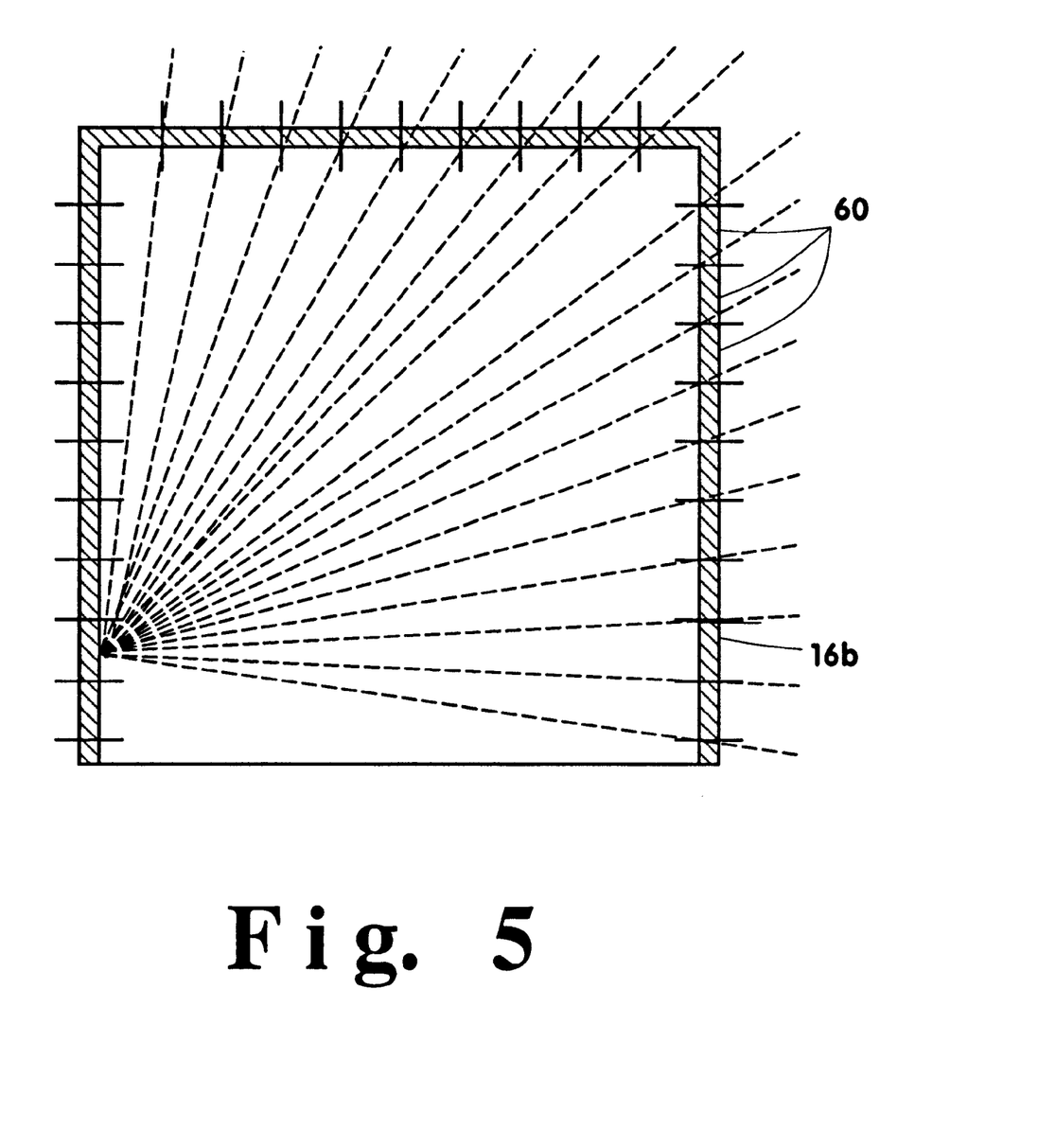
FIG. 5 is a schematic of a simple model for optimization of non-planar targets.

This modeling can be predicted based on the integration of sputtered material from each point of the target according to its solid angle view of the rest of the target. In the simplest case, as illustrated in FIG. 5 for a simple non-planar target 16b, one can assume a uniform angular distribution for the sputtered material instead of a customary cosine functional form. Next, the target is mathematically divided into a finite number of equal length segments 60. Each segment 60 is considered as a point source with a sputtered efficiency of one. Then, the sputtered material contribution from each segment to the rest is calculated based on the solid angle view of the point source. The net erosion for each segment is obtained by subtracting the sputtered material from the segment, and from the amount of deposition due to other segments of the target.

The model is further refined by considering that the contribution of each segment is not uniformly distributed to the rest of the target, i.e., it has a cosine functional form. Thus, segments on the target that are located at grazing angles receive less material than segments that receive target material at angles nearly orthogonal to the segment target surface.

Using the above approach, a prospective target geometry is optimized by analytically comparing and evaluating the methodology's results of one geometry against that of another geometry, or by simply altering the first geometry and recalculating and comparing the results of the first geometry against the altered geometry. In this manner, optimized target shapes can be analytically obtained and assessed. The results of the analysis for two different shaped targets, a cylindrical shaped target and a trapezoidal shaped target, are shown in FIGS. 6 through 9.

Figure 6:
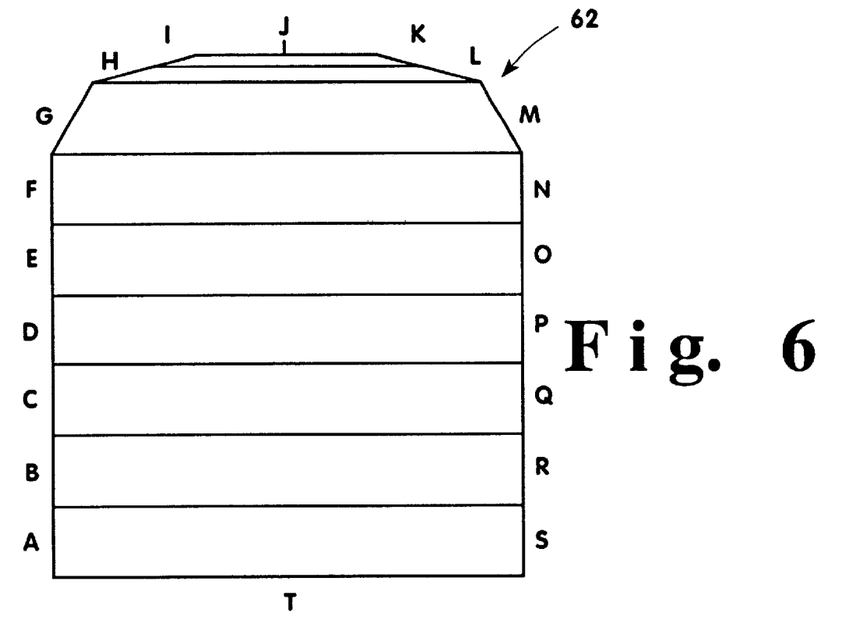
FIG. 6 is a schematic of the cross section of a cylindrical target, sectioned by the modeling technique of the present invention.
Figure 7:
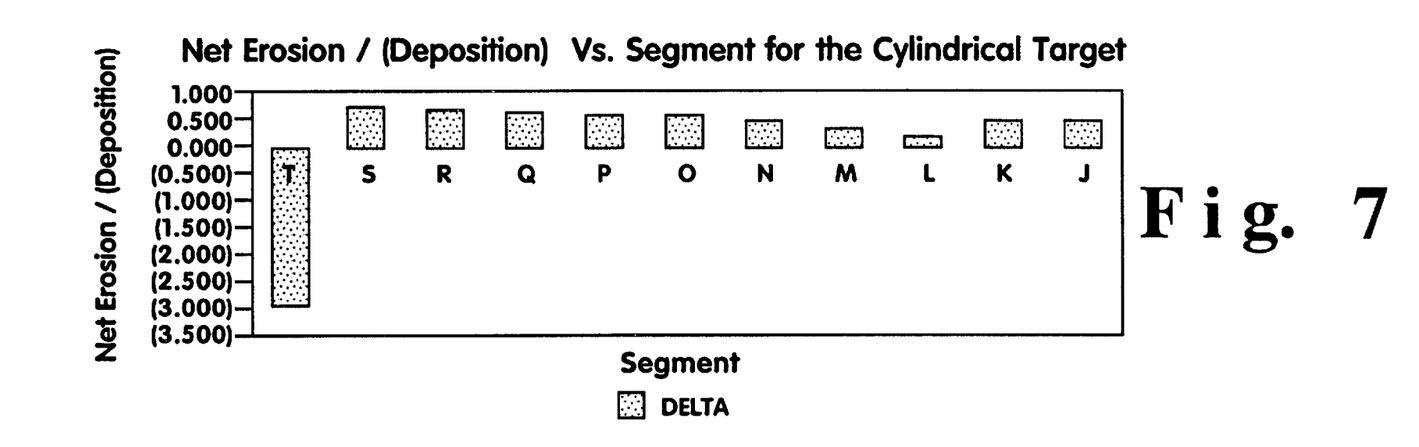
FIG. 7 is a graph that depicts the change in the level of net erosion and deposition calculated by the preferred methodology for the cylindrical target of FIG. 6.

FIG. 6 is a schematic of the cross section of a cylindrical target 62, sectioned by the preferred modeling technique, having sections A through S. FIG. 7 is a graph that depicts the change in the level of net erosion and deposition calculated for the target segments of FIG. 6. Taking advantage of the target symmetry and providing analysis results for one side of the target, the cylindrical target has an area of maximum erosion, as indicated by the FIG. 7 graph, at segment "S" and an area of minimum erosion, calculated to be approximately 19% of maximum, at segment "L". There is gradual decrease, on the order of 96% to 83% of maximum, in erosion in segments "R" through "O", and a rapid decrease of approximately 62% to 32% of maximum at segments "N" and "M". There is a corresponding increase in erosion from segments "K" through "J". This data is comparable to the actual data obtained from a cylindrical target, although this simplified model does not directly account for magnetic or ionic effects on the sputtering. This model, however, may be modified to accommodate these effects if so desired.

Figure 8:
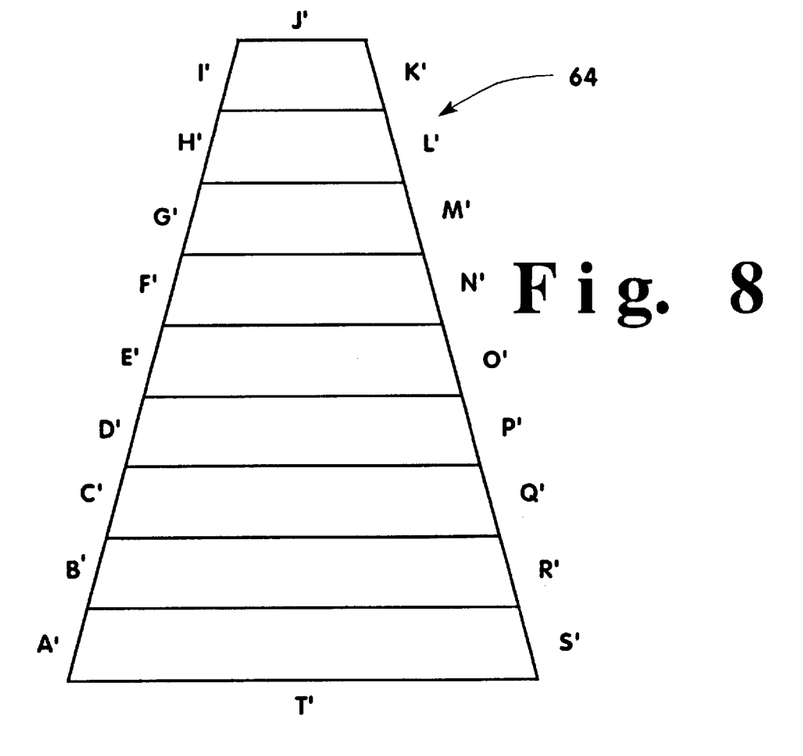
FIG. 8 is a schematic of the cross section of a trapezoidal target, sectioned by the modeling technique of the present invention.
Figure 9:
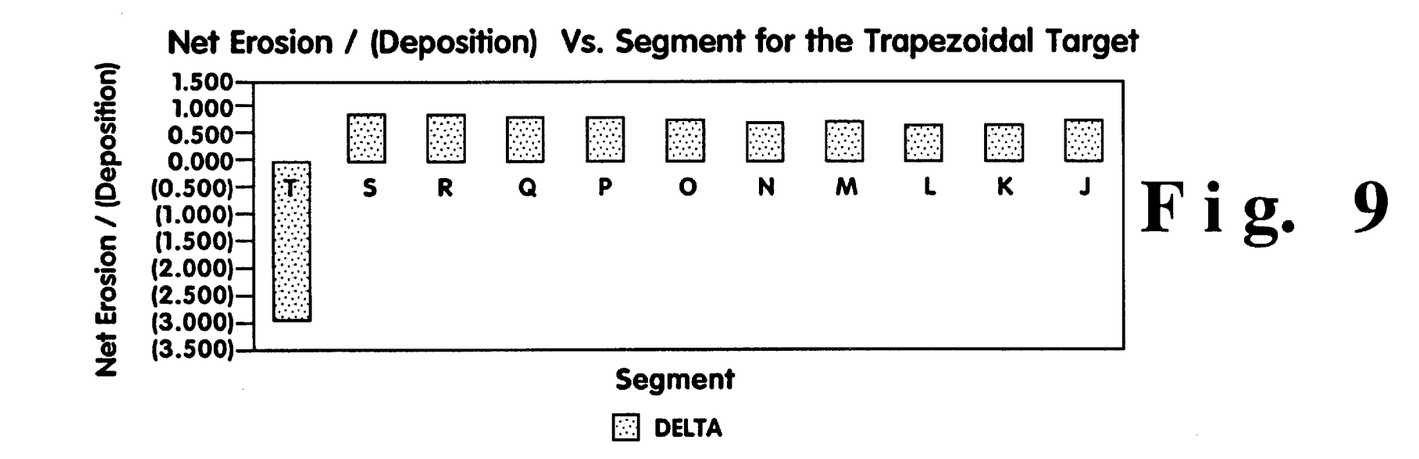
FIG. 9 is a graph that depicts the change in the level of net erosion and deposition calculated by the preferred methodology for the target shaped as depicted in FIG. 8.

FIG. 8 is a schematic of the cross section of a trapezoidal target 64 sectioned by the modeling technique. FIG. 9 is a graph that depicts the change in the level of net erosion and deposition calculated for the target segments of FIG. 8. Again, taking advantage of the target symmetry and providing analysis results for one side of the target, the trapezoidal target has a maximum erosion, as indicated in FIG. 9, at segment "S'" and an minimum erosion (23% of maximum) at segment "J'". There is a gradual decrease of approximately 96% to 77% in erosion at segments "R'" through "K'".

From this comparison, it is evident that the trapezoidal target has the advantage of less redeposition in the interface of the-side wall and top surface over the cylindrical target (segments "K" through "M"). This makes sense because the areas of the target that contribute most of the solid angle sputtering to the region are small in comparison to the rest of the target. In the case of the cylindrical target, there is a large contribution of redeposition from the large vertical surface area and large top surface onto the corner regions of the target. However, the trapezoidal target shows a larger effect of redeposition at the top surface than the cylindrical target (23% of maximum as opposed to 62%, respectively).

In such a case, it is then possible to adjust the amount of erosion by making changes in the design of the magnetic fields around the target to achieve the desired erosion.

Figure 10A:
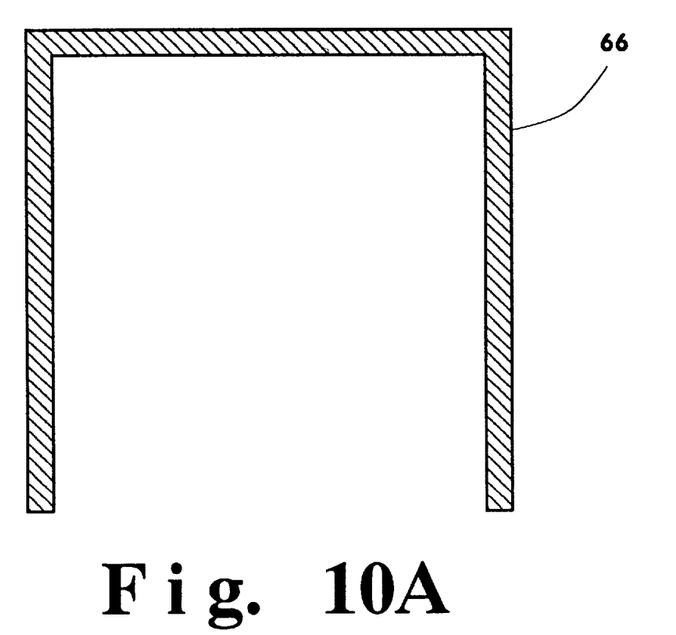
FIG. 10A is a schematic of the cross-section of a cylindrical copper target.
Figure 10B:
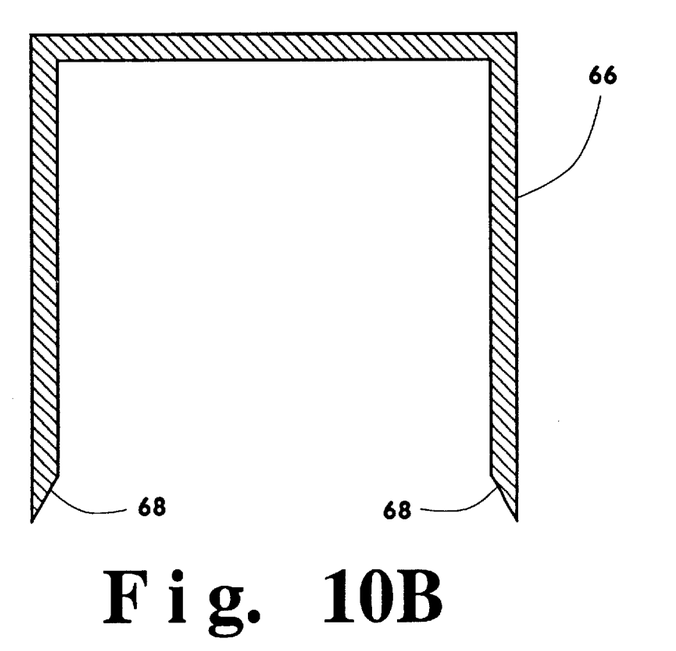
FIG. 10B is a schematic of the cross-section of the cylindrical copper target of FIG. 10A with the target mouth slightly modified to obtain better sheet resistance uniformity on the wafer.

As it can be seen from the above example, shaping of the target can become a powerful tool for controlling target erosion. The effects on the process characteristics can be as dramatic as well and can easily be evaluated. As an example, a cylindrical copper target 66, with a cross-sectional shape as indicated by FIG. 10A, was reshaped in a very subtle manner, as shown in FIG. 10B, to investigate the effects of target shaping on sheet resistance ($R_s$) non-uniformity across a 200 mm wafer. In FIG. 10B, the target mouth 68 is slightly modified to obtain better sheet resistance uniformity on the wafer. A 10% improvement in $R_s$ uniformity was immediately achieved. Thus, a slight modification of the target shape can result in significant changes in process parameters.

Due to the versatility of the modeling methodology, non-planar target shapes are not necessarily exclusive to the shapes shown in this application. Nor is his particular methodology exclusive to the application of HCM sputtering sources.

Different non-planar target shapes, as shown for example in FIG. 4, can be designed to address specific attributes of the magnetron sputtering process such as erosion uniformity, process uniformity, particulate generation control, and the like.

Figure 11:
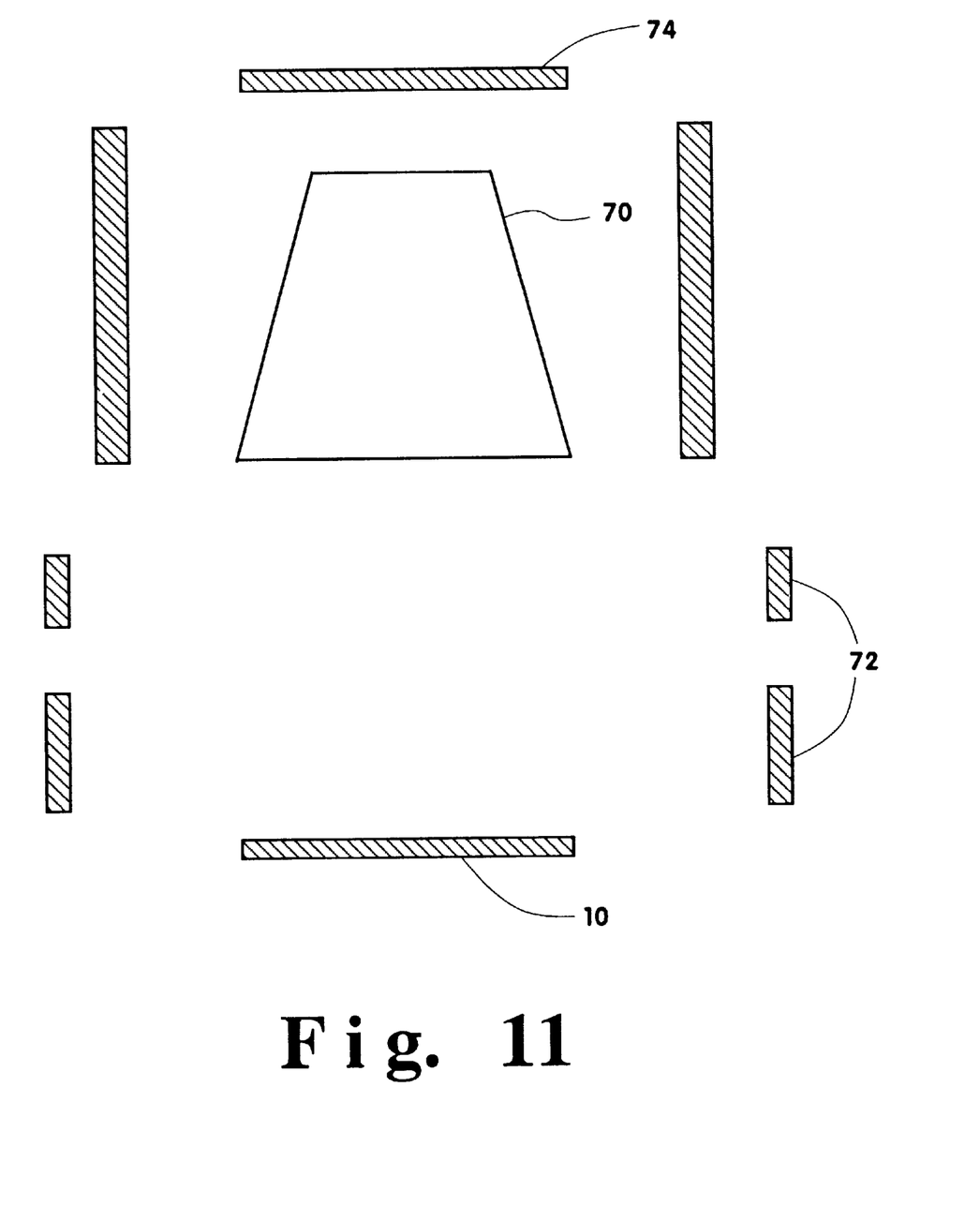
FIG. 11 is a schematic of a preferred embodiment of an HCM sputtering device having a target modeled using the modeling technique of the present invention.

In a preferred embodiment of an apparatus utilizing a target shaped by the described methodology and depicted in FIG. 11, a target 70 that is trapezoidal in shape is introduced. This shape has also been depicted in FIG. 4 (item 50). The magnets 72, 74 for this HCM sputtering apparatus may be permanent magnets or electromagnets. One or more coils can be used below the main magnet stack. Magnet 74 is a rotating magnet used for controlling top erosion. Downstream electromagnets 72 are used to further improve process uniformity, and wafer 10 remains the subject of the deposition process. An electric field generator induces a plasma within the vacuum chamber; gas in the chamber is ionized by collision with electrons ejected from the surface of the cathode or target. Erosion and sputter particle directionality is optimized for the system when compared to the conventional target geometries.

Using this modeling technique, the following objects of the invention can be analytically assessed and readily achieved:

I) shaping of a non-planar target as means of controlling directionality and target erosion;

II) shaping of a non-planar target as means of improving target life and utilization;

III) shaping of a non-planar target as a means of controlling particulate generation for ultra-clean magnetron sputtering applications;

IV) shaping of a non-planar target as a means of controlling process characteristics such as a Rs uniformity, step coverage, and the like; and, V) shaping of a non-planar target as a means for making a directional source for depositing metal layers which have an acceptably high deposition rate.

Figure 12:
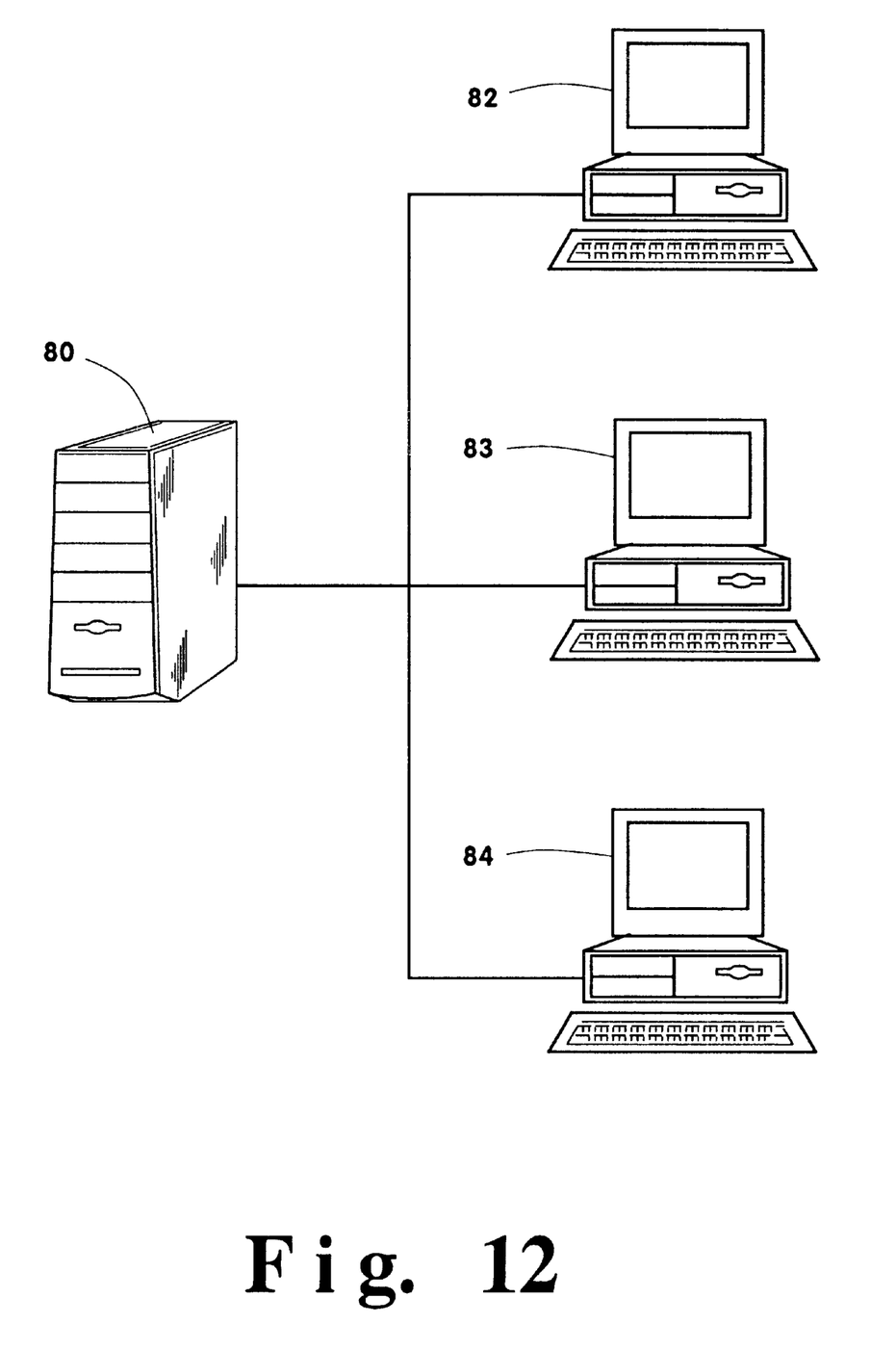
FIG. 12 is a drawing of a computer system having interconnect devices used for modeling the sputtering target and comparing sputtering target geometries.

Additionally, this methodology may be performed by means of a microprocessor based computer system. FIG. 12 depicts a machine or computer 80 interconnected to I/O devices 82, 83 and 84. A user may model the sputtering target and input information to the computer for calculations and comparisons of sputtering target geometries. Hence the methodology may be in the form of a program storage device readable by a machine, tangibly embodying a program of instructions executable by the machine to perform the method steps for modeling non-planar sputtering target shapes, said method steps comprising: a) selecting a first non-planar sputtering target geometry; b) dividing the non-planar sputtering target into a finite number of target segments, each segment defining a surface area of said target; c) calculating for each of said target segments a contribution of sputtered material from each of the other of said target segments; and, d) calculating the net erosion for each of said target segments.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of modeling non-planar sputtering target shapes for sputtering particles from a magnetron target onto a substrate including the following steps:
   a) selecting a first non-planar sputtering target geometry;
   b) dividing the non-planar sputtering target into a finite number of target segments, each segment defining a surface area of said target;
   c) calculating for each of said target segments a contribution of sputtered material from each of the other of said target segments; and,
   d) calculating net erosion for each of said target segments.

2. The method of claim 1 further including the steps of:
   e) selecting a second non-planar sputtering target geometry;
   f) performing said steps (b) through (d) on said second non-planar sputtering target geometry; and,
   g) comparing said net erosion calculations for said first and second non-planar target geometries.

3. The method of claim 2 further including the steps of:
   h) calculating process parameters for each of said target geometries; and,
   i) comparing said process parameter calculations for said first and second non-planar target geometries.

4. The method of claim 2 further including selecting a second non-planar target geometry wherein said geometry is different from said first non-planar target geometry and is parabolic, cylindrical, elliptical, trapezoidal, hemispherical, or cone shaped.

5. The method of claim 4 wherein said cylindrical geometry further includes cylindrical-elliptical, cylindrical-parabolic, cylindrical-trapezoidal, or cylindrical-domed.

6. The method of claim 4 wherein said non-planar target has a corrugated top surface.

7. The method of claim 2 further including assigning to each of said target segments of said second non-planar target geometry a uniform angular distribution of sputtered material.

8. The method of claim 2 further including assigning to each of said target segments of said second non-planar target geometry a non-uniform functional angular distribution of sputtered material.

9. The method of claim 8 further including assigning to each of said target segments of said second non-planar target geometry a non-uniform cosine functional angular distribution of sputtered material.

10. The method of claim 1 further including assigning to each of said target segments a uniform angular distribution of sputtered material.

11. The method of claim 1 further including assigning to each of said target segments a non-uniform functional angular distribution of sputtered material.

12. The method of claim 11 further including assigning to each of said target segments a non-uniform cosine functional angular distribution of sputtered material.

13. The method of claim 1 further including selecting a non-planar target geometry wherein said geometry is parabolic, cylindrical, elliptical, trapezoidal, hemispherical, or cone shaped.

14. The method of claim 13 wherein said cylindrical geometry further includes cylindrical-elliptical, cylindrical-parabolic, cylindrical-trapezoidal, or cylindrical-domed.

15. The method of claim 13 wherein said non-planar target has a corrugated top surface.

16. The method of claim 1 wherein said sputtering target is used in hollow cathode magnetron sputtering device.

17. The method of claim 1 wherein during the calculation each of said target segments is considered as a point source with a sputtered efficiency of one.

18. The method of claim 1 further including accounting for magnetic and ionic effects on sputtering.

19. An apparatus for sputtering particles from a magnetron target onto a substrate, said apparatus comprising:
   a) a vacuum chamber for enclosing said target and said substrate;
   b) a process gas source;
   c) said magnetron target having a geometry optimized by the method of claim 1 such that said target geometry is calculated to control erosion and redeposition of target material;
   d) a voltage source for producing an incident electric field to accelerate ionized gas atoms towards said target; and,
   e) a magnetic field source comprising:
      i) a rotating magnet;
      ii) downstream electromagnets; and,
      iii) a main magnet stack.

20. The apparatus of claim 19 further comprising a target having a geometry comprising parabolic, cylindrical, elliptical, trapezoidal, hemispherical, or cone shaped targets.

21. The apparatus of claim 19 wherein said main magnet stack and said rotating magnet are comprised of electromagnets or permanent magnets.

22. A method for optimizing a non-planar sputtering target shape for sputtering particles from a magnetron target onto a substrate comprising the steps of:
   a) selecting an initial non-planar sputtering target geometry;
   b) dividing said non-planar sputtering target into a finite number of target segments;
   c) calculating for each of said target segments a contribution of sputtered material from each of the other of said target segments;
   d) calculating net erosion for each of said target segments;
   e) calculating redeposition of sputtered material from each of said target segments;
   f) calculating net deposition from each of said target segments on a wafer;
   g) minimally altering said target geometry and performing steps (b) through (f); and,
   h) repeating said step (g) until said wafer has a calculated uniform thin-film deposition of target material and optimized minimum amounts of said redeposition and said target erosion.

23. The method of claim 22 further including the steps of:
   i) calculating process parameters for said selected target geometry; and,
   j) comparing said process parameter calculations during said step (g) such that said process parameters are optimized.

24. The method of claim 22 further including assigning to each of said target segments a uniform angular distribution of sputtered material.

25. The method of claim 22 further including assigning to each of said target segments a non-uniform functional angular distribution of sputtered material.

26. The method of claim 25 further including assigning to each of said target segments a non-uniform cosine functional angular distribution of sputtered material.

27. The method of claim 22 wherein calculating said ent erosion further includes adjusting for erosion by inducing changes in design of applied magnetic fields.

28. An apparatus for sputtering particles from a magnetron target onto a substrate, said apparatus comprising:
   a) a vacuum chamber for enclosing said target and said substrate;
   b) a process gas source;
   c) said magnetron target having a geometry optimized by the method of claim 19 such that said target geometry is calculated to control erosion and redeposition of target material;
   d) a voltage source for producing an incident electric field on said target; and,
   e) a magnetic field source comprising:
      i) a rotating magnet;
      ii) downstream electromagnets; and,
      iii) a main magnet stack.

29. An apparatus for sputtering ionic particles from a hollow cathode magnetron target onto a substrate, said apparatus having a single plasma source, and comprising:
   a) a vacuum chamber for enclosing said target and said substrate;
   b) a process gas source;
   c) a trapezoidal sputtering target;
   d) a voltage source for producing an incident electric field to accelerate ionized gas atoms towards said target; and,
   e) a magnetic field source comprising:
      i) a rotating magnet;
      ii) downstream electromagnets; and,
      iii) a main magnet stack; and,
   f) an electric field induced plasma stream.

30. An apparatus for sputtering ionic particles from a hollow cathode magnetron target onto a substrate, said apparatus having a single plasma source, and comprising:
   a) a vacuum chamber for enclosing said target and said substrate;
   b) a process gas source;
   c) said magnetron target having a geometry comprising parabolic, cylindrical, elliptical, hemispherical, or cone shaped targets;
   d) a voltage source for producing an incident electric field on said target; and,
   e) a magnetic field source comprising:
      i) a rotating magnet;
      ii) downstream electromagnets; and,
      iii) a main magnet stack.

* * * * *

UNITED STATES PATENT AND TRADEMARK OFFICE
CERTIFICATE OF CORRECTION

PATENT NO.    : 6,500,321 B1
DATED         : December 31, 2002
INVENTOR(S)   : K. Ashtiani et al.

It is certified that error appears in the above-identified patent and that said Letters Patent is hereby corrected as shown below:

<u>Column 8,</u>
Line 58, delete "the-side" and substitute therefor -- the side --.

<u>Column 12,</u>
Line 18, delete "ent" and substitute therefor -- net --.

Signed and Sealed this

Seventeenth Day of June, 2003

JAMES E. ROGAN
*Director of the United States Patent and Trademark Office*